(12) United States Patent
Kawamura et al.

(10) Patent No.: US 10,583,983 B2
(45) Date of Patent: Mar. 10, 2020

(54) CONTAINER STORAGE FACILITY

(71) Applicant: Daifuku Co., Ltd., Osaka-shi (JP)

(72) Inventors: Shinsuke Kawamura, Hinocho (JP); Tadahiro Yoshimoto, Hinocho (JP)

(73) Assignee: Daifuku Co., Ltd., Osaka-shi (JP)

( * ) Notice: Subject to any disclaimer, the term of this patent is extended or adjusted under 35 U.S.C. 154(b) by 200 days.

(21) Appl. No.: 15/474,364

(22) Filed: Mar. 30, 2017

(65) Prior Publication Data

US 2017/0283170 A1 Oct. 5, 2017

(30) Foreign Application Priority Data

Mar. 31, 2016 (JP) ................................. 2016-070793
Jul. 14, 2016 (JP) ................................. 2016-139587

(51) Int. Cl.
*H01L 21/673* (2006.01)
*B65G 1/04* (2006.01)
*H01L 21/677* (2006.01)

(52) U.S. Cl.
CPC ...... *B65G 1/0407* (2013.01); *H01L 21/67393* (2013.01); *H01L 21/67769* (2013.01); *F17C 2221/031* (2013.01); *F17C 2223/0123* (2013.01)

(58) Field of Classification Search
CPC ......... H01L 21/67769; H01L 21/67393; H01L 21/67389; B65G 1/0407
See application file for complete search history.

(56) References Cited

U.S. PATENT DOCUMENTS

| 8,942,844 | B2 * | 1/2015 | Takahara | ................. B65G 1/06 700/213 |
| 9,595,461 | B2 * | 3/2017 | Takahara | ................. F17C 13/02 |
| 9,997,387 | B2 * | 6/2018 | Murata | ................. H01L 21/673 |
| 10,325,794 | B2 * | 6/2019 | Murata | ............. H01L 21/67389 |
| 2011/0114129 | A1 | 5/2011 | Kishkovich et al. | |
| 2015/0004899 | A1 | 1/2015 | Otsuka et al. | |
| 2017/0140949 | A1 | 5/2017 | Onishi et al. | |
| 2018/0076055 | A1 * | 3/2018 | Abe | ...................... H01L 21/673 |

FOREIGN PATENT DOCUMENTS

| CN | 104253076 A | 12/2014 |
| JP | 2011507309 A | 3/2011 |
| JP | 2013133193 A | 7/2013 |
| JP | 201621429 A | 2/2016 |
| WO | 2015194252 A1 | 12/2015 |

* cited by examiner

*Primary Examiner* — Timothy P. Kelly
(74) *Attorney, Agent, or Firm* — The Webb Law Firm

(57) ABSTRACT

A gas supplying device has a plurality of connectors each of which is configured to be connected to a container stored in the corresponding one of supplying storage sections, supply lines configured to divide and supply gas to the plurality of connectors, and a mass flow controller configured to control a flow rate of gas that flows through one of the supply lines. The supply lines include first supply lines each of which is installed to a corresponding supplying storage sections, a second supply line installed upstream of the first supply lines, and a branching supply line for dividing gas supplied from the second supply line into the first supply lines. The mass flow controller is installed in the second supply line and in an installation area.

17 Claims, 4 Drawing Sheets

CONTAINER STORAGE FACILITY

CROSS-REFERENCE TO RELATED APPLICATIONS

This application claims priority to Japanese Patent Application Nos. 2016-070793 and 2016-139587, filed Mar. 31, 2016 and Jul. 14, 2016, respectively, the disclosures of which are hereby incorporated in their entirety by reference.

FIELD OF THE INVENTION

The present invention relates to a container storage facility comprising a plurality of storage sections which are installed in a storing area and each of which is configured to store a container, a gas supplying device configured to supply gas to inside of containers stored in supplying storage sections, with a part or all of the plurality of storage sections in the storing area being the supplying storage sections, wherein the gas supplying device has a plurality of connectors each of which is installed to a corresponding one of the supplying storage sections and is configured to be connected to a container stored in the corresponding one of the supplying storage sections, supply lines configured to divide and supply gas supplied from a supply source installed outside the storing area to the plurality of connectors, and a mass flow controller configured to control a flow rate of gas that flows through one of the supply lines.

BACKGROUND

An example of a conventional container storage facility is disclosed in JP Publication of Application No. 2013-133193 (Patent Document 1). In the container storage facility of Patent Document 1, each supplying storage section group consists of a plurality of supplying storage sections or locations belonging to one zone. A gas supplying device has two or more first supply lines with one first supply line provided for each of two or more supplying storage sections that form a supplying storage section group. And the gas supplying device of Patent Document 1 is arranged such that gas supplied from a second supply line is split into two or more first supply lines to supply gas to each of the two or more supplying storage sections that form a supplying storage section group.

And in the container storage facility of Patent Document 1, a mass flow controller of each gas supplying device is installed in the flow path of each of two or more first supply lines. In addition, the mass flow controller is installed in the storing area in which the storage sections are installed. More specifically, each mass flow controller is located such that, when a container is stored in the storage section, the mass flow controller is located adjacent, and to one side of, the container.

SUMMARY OF THE INVENTION

The mass flow controllers are installed in the storing area in which the storage sections are installed in the conventional container storage facility described above; thus, when the temperature of a mass flow controller rises, the rise in the temperature may affect the container stored in the storage section, and in particular, the contents of the container.

In addition, the first supply line is installed in each of the plurality of supplying storage sections, and a mass flow controller is installed in each of the plurality of first lines. Thus, many mass flow controllers have to be installed in the facility, contributing to an increase in the manufacturing cost of the gas supplying device.

Thus, a container storage facility is desired in which containers in a storing area are not easily subjected to the effect of a rise in the temperature of the mass flow controller and in which the manufacturing cost of a gas supplying device can be reduced.

A feature of a container storage facility in accordance with the present disclosure is that the container storage facility comprises: a plurality of storage sections which are installed in a storing area and each of which is configured to store one or more containers; a gas supplying device configured to supply gas to inside of containers stored in supplying storage sections, with a part or all of the plurality of storage sections in the storing area being the supplying storage sections; wherein the gas supplying device has a plurality of connectors each of which is installed to a corresponding one of the supplying storage sections and is configured to be connected to a container stored in the corresponding one of the supplying storage sections, supply lines configured to divide and supply gas supplied from a supply source installed outside the storing area to the plurality of connectors, and a mass flow controller configured to control a flow rate of gas that flows through one of the supply lines, wherein, for a supplying storage section group formed by a part or all of the supplying storage sections, the supply lines include two or more first supply lines each of which is installed to a corresponding one of two or more supplying storage sections which form the supplying storage section group, a second supply line which forms a single flow path installed upstream of the two or more first supply lines with respect to a direction of flow of gas, and a branching supply line for dividing gas supplied from the second supply line into the two or more first supply lines, and wherein the mass flow controller is installed in the single flow path of the second supply line and in an installation area located outside the storing area.

With the arrangement described above, by installing a mass flow controller in the second supply line, one mass flow controller is provided for a plurality of supplying storage sections that form a supplying storage section group. Thus, the number of the mass flow controllers that have to be installed can be reduced, contributing to a reduction in the manufacturing cost of the gas supplying device. In addition, providing a mass flow controller in the second supply line located upstream of the first supply lines makes it easier to install the mass flow controller at a position away from the storage sections. And by providing the mass flow controller in the area located outside the storing area in which the plurality of storage sections are installed, the containers stored in the storage sections are not easily subjected to the effect of a rise in the temperature of the mass flow controller.

DETAILED DESCRIPTION

First Embodiment

The first embodiment of a container storage facility is described with reference to the attached drawings.

Figure 1:
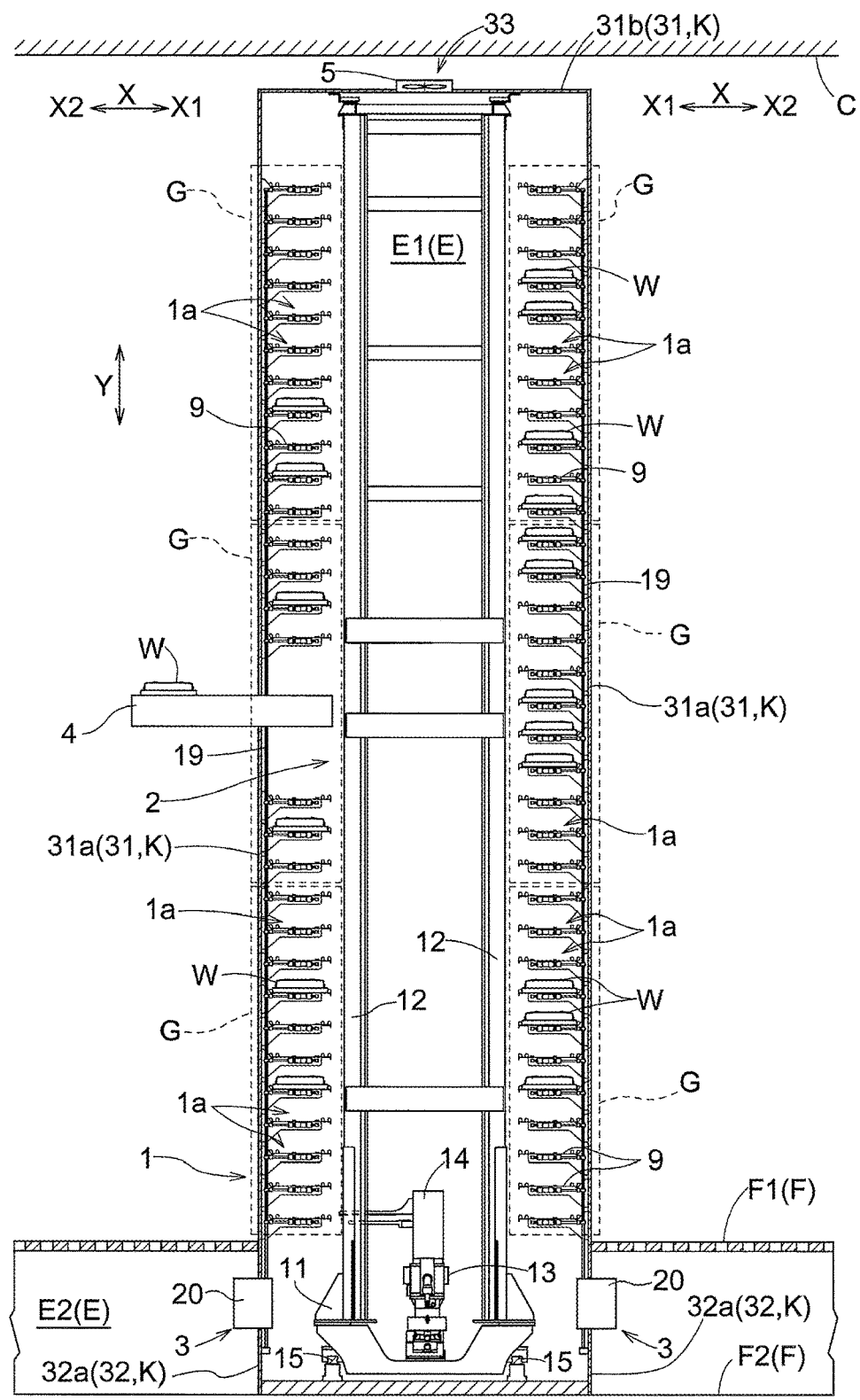
FIG. 1 is a side view of a container storage facility in accordance with a first embodiment.

As shown in FIG. 1, the container storage facility has storage racks 1 configured to store containers W, a stacker crane 2 configured to transport containers W one container W at a time, and gas supplying devices 3. In addition, the container storage facility has walls K that cover the sides of the storing area E1 in which the storage racks 1 and the stacker crane 2 are installed, and transport conveyors 4 each configured to transport the containers W and so installed that each extends through a wall K. The walls K collectively form a wall assembly.

Each storage rack 1 has a plurality of storage sections 1a each of which can store a container W. Each gas supplying device 3 is configured to supply clean dry air (referred to simply hereinafter as "dry air") as gas to inside of the containers W stored in the storage sections 1a. In other words, the gas supplied to the inside of each container W by the gas supplying device 3 has lower humidity than the gas in the storage sections 1a.

Each container W is configured to be capable of holding one substrate. In the present embodiment, the substrate is a reticle, and each container W is a container W for storing a reticle.

Each transport conveyor 4 is installed to transport a container W between an outside location outside of a wall K, and an inside location inside the wall K. One transport conveyor 4 is installed at a higher position and another at a lower position. A ceiling or overhead transport vehicle (not shown) transfers a container W to or from the outside location corresponding to the transport conveyor 4 installed at the higher position. A human worker transfers a container W to or from the outside location corresponding to the transport conveyor 4 installed at the lower position. Note that the transport conveyor 4 installed at the lower position is not shown in the drawings.

And the stacker crane 2 is configured to transport containers W one at a time between the inside location of either transport conveyor 4 and any of the storage sections 1a of either of the storage racks 1.

The container storage facility is installed in a clean room of a down-flow type in which air (gas) flows downward in the interior area E from the ceiling side toward the floor side. To describe in more detail, a blower fan 5 for causing gas to flow downward is installed directly above the storing area E1. The air blowing action of this blower fan 5 causes gas to flow downward from the ceiling side toward the floor side through the storing area E1 and an installation area E2. Note that the blower fan 5 is, or corresponds to, the flow generating device configured to cause gas to flow downward from the ceiling side toward the floor side through the storing area E1 and the installation area E2.

The floor portion F of the clean room includes a lower floor portion F2, and an upper floor portion F1 provided above the lower floor portion F2. The lower floor portion F2 is a floor which does not have through holes for allowing gas to pass through (ventilating holes for short). In the present embodiment, the lower floor portion F2 is a concrete floor without through holes. The stacker crane 2 travels on this lower floor portion F2. The upper floor portion F1 is a grating floor in which ventilating holes that extend through the vertical direction Y are formed. Workers walk on this upper floor portion F1. Note that the upper floor portion F1 is, or corresponds to, the work floor which is installed below a lower ceiling portion C2 (see FIG. 5) and above the lower floor portion F2, and which is configured to allow gas to pass through it (therethrough) along the vertical direction Y.

In the following description, a front and back direction, inward and outward directions are defined as seen along a longitudinal direction of the storage rack 1 (a travel direction in which the stacker crane 2 travels) with a front and back direction X being defined to be a direction along which the storage racks 1 and the stacker crane 2 are next to one another, and with each inward direction X1 being defined to be a direction in which the stacker crane 2 exists with respect to a storage rack 1, and the direction opposite from the inward direction X1 being defined to be an outward direction X2. Note that the front and back direction X coincides with the direction of thickness (thickness direction) of the above-floor walls 31. In addition, an inward direction X1 is a first direction in which the storing area E1 exists with respect to an above-floor wall 31 whereas an outward direction X2 is a second direction which is opposite from the first direction. In addition, the interior area E consists of an area covered or surrounded by the walls K and an area below the upper floor portion F1.

The walls K cover or surround the storing area E1. Air is restricted or, more preferably, prevented from flowing into the storing area E1 other than from an intake opening 33 by this arrangement. The walls K include the above-floor walls 31 and below-floor walls 32. The above-floor walls 31 are located at a higher position than the top surface of the upper floor portion F1 and below the ceiling C. The below-floor walls 32 are located at a lower position than the top surface of the upper floor portion F1 and at a higher position than the lower floor portion F2.

As shown in FIG. 1, the below-floor walls 32 are arranged to generally form a shape of a rectangular tube having four below-floor wall members 32a. Outlet openings (not shown), each of which allows air to flow out from an inward direction X1 side of the below-floor wall members 32a to an outward direction X2 side, are formed in below-floor wall members 32a.

The above-floor walls 31 are also arranged to generally form a shape of a rectangular tube having four below-floor wall members 31a. In addition to the below-floor wall members 31a, the above-floor walls 31 include an upper wall member 31b which forms the top surface of the above-floor walls 31. The below-floor wall members 31a are so located and arranged to restrict or, more preferably, prevent air from flowing into the storing area E1 through portions other than the intake opening 33. Note that FIG. 1 shows an above-floor wall member 31a that closes off, or covers, one side along (i.e., in a direction parallel to) the front and back direction X, another above-floor wall member 31a that closes off, or covers, the other side along the front and back direction X, and the upper wall member 31b which forms the top surface.

The intake opening 33 which allows air to flow into the storing area E1 from above the above-floor wall 31 is formed in an upper portion of the above-floor walls 31. To describe in more detail, the upper wall member 31b which forms the top surface of the above-floor walls is provided in the upper end of the above-floor walls 31. The intake opening 33 which allows air to flow through along the vertical direction Y is formed in a part of the upper wall member 31b. The blower fan 5 is installed in the upper wall member 31b such that it covers the intake opening 33. Note that each above-floor wall 31 is, or correspond to, each primary wall which is installed to extend vertically (along the vertical direction Y) and which is so located to be spaced apart from the lower floor portion F2.

And thus, arrangements are made such that air that was caused to flow, by the air blowing action of the blower fan 5, into the area inside the walls K through the intake opening 33 formed in the upper end of the walls K flows from the upper area downward through the storing area E1 within the walls K and subsequently flows out of the walls K through the outlet openings formed in the below-floor wall members 32a of the walls K.

[Container]

Figure 4:
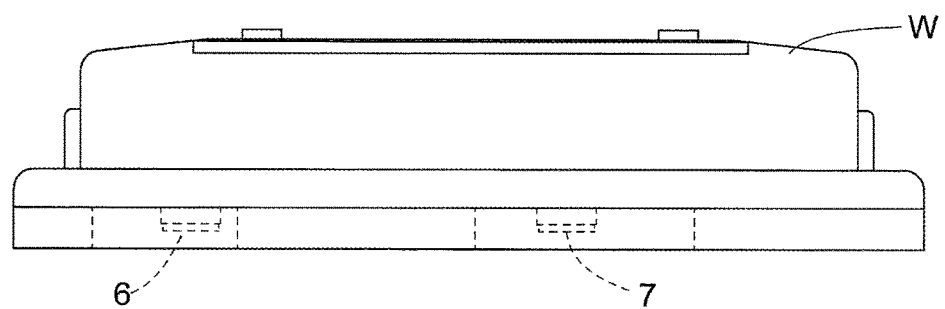
FIG. 4 is a front view of a container in accordance with the first embodiment.

As shown in FIG. 4, a gas introducing portion 6 and a gas discharge portion 7 are provided in the bottom portion of the container W. The gas introducing portion 6 is a portion for supplying dry air released from a connector 18 of a gas supplying device 3 to inside the container W. The gas introducing portion 6 is provided with an intake opening and closing valve (or an on-off valve, not shown). The gas discharge portion 7 is a portion for allowing the gas inside the container W to flow out of the container W. The gas discharge portion 7 is provided with an outlet opening and closing valve (not shown).

The intake opening and closing valve of the gas introducing portion 6 is urged toward its closed position by an urging member, such as a coil spring. When dry air is ejected from the connector 18 of the gas supplying device 3 with the connector 18 connected to the gas introducing portion 6, the intake opening and closing valve is opened by the pressure of the ejected dry air, allowing dry air to be supplied to inside the container W through the gas introducing portion 6. In addition, the outlet opening and closing valve of the gas discharge portion 7 is urged toward its closed state by an urging member, such as a coil spring. When the pressure inside the container W increases as a result of the dry air being supplied by the gas supplying device 3, the outlet opening and closing valve is opened by this pressure, allowing the gas inside the container W to be released through the gas discharge portion 7.

[Storage Rack]

As shown in FIG. 1, each storage rack 1 has storage sections or locations 1a which are arranged one above another along the vertical direction Y and one next to another along a lateral direction (i.e., a horizontal direction along which the storage rack extends).

Figure 3:
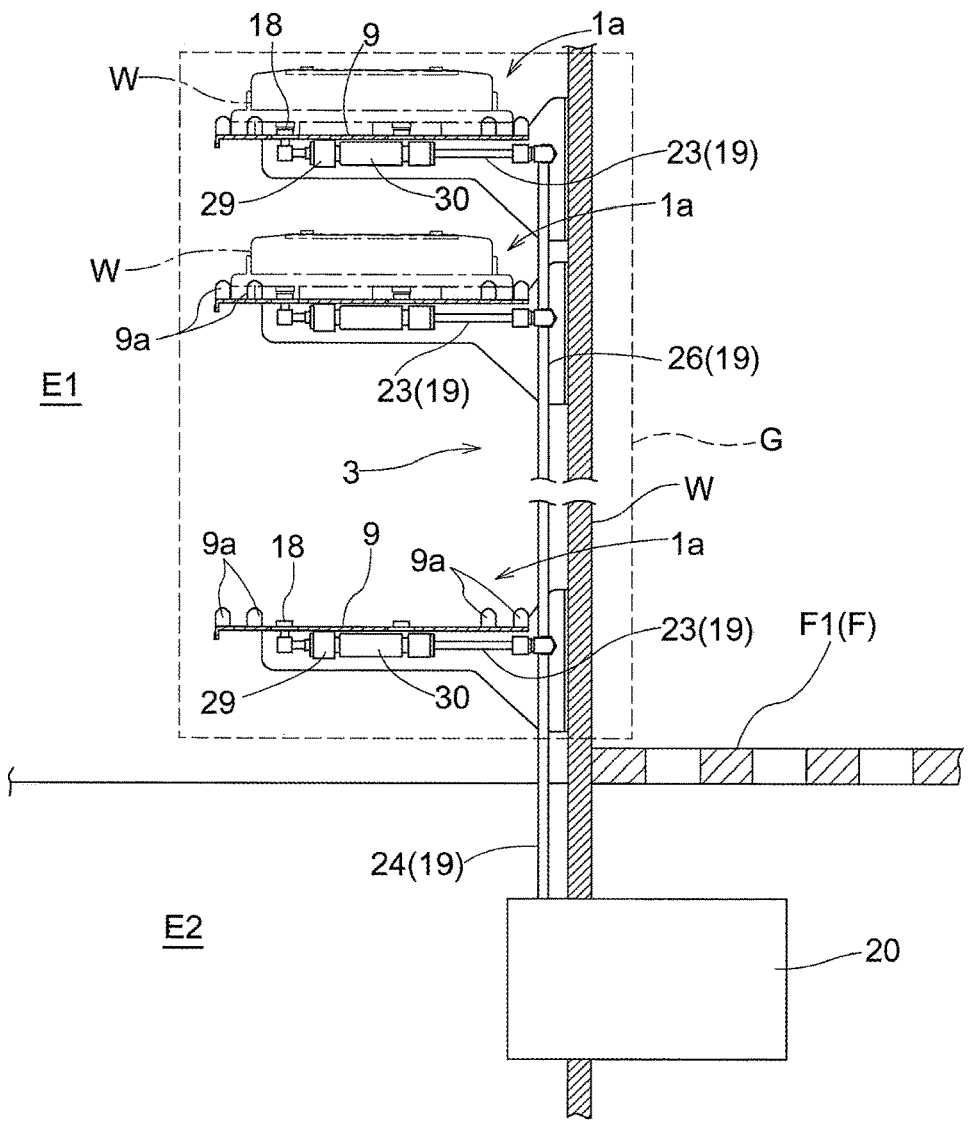
FIG. 3 shows supply lines to a supplying storage section group in accordance with the first embodiment.

As shown in FIGS. 1 and 3, each of the plurality of storage sections 1a has a support member 9 configured to support a container W from below. The storage section 1a is configured to store a container W with the container W supported from below by the support member 9. Each support member 9 is provided with projections 9a for properly positioning the container W in its predetermined position along a horizontal direction. In addition, the support member 9 supports the connector 18 configured to be connected to the container W stored in the storage section 1a. This connector 18 connects with the gas introducing portion 6 of the container W when the container W is supported in its predetermined position of the support member 9. The connector 18 is located at a position such that it can connect to the gas introducing portion 6 of the container W when the container W is supported by the support member 9 in its predetermined position.

In other words, when a container W is brought in to be stored in a storage section 1a and is thus supported by the support member 9, the container W is properly positioned into its predetermined position by the projections 9a and the connector 18 is connected to the gas introducing portion 6. And thus it is so arranged that, when dry air is discharged from the connector 18 with the container W supported by the support member 9, the dry air is supplied to inside the container W through the gas introducing portion 6 and gas inside the container W is released out of the container W through the gas discharge portion 7.

A connector 18 is provided to and supported by the support member 9 of each of the plurality of storage sections 1a. Thus, all of the plurality of storage sections 1a in each storage rack 1 are supplying storage sections in which dry air is supplied by the gas supplying device 3.

Therefore, in the following description, a supplying storage section will be referred to simply as a storage section 1a.

Each storage rack 1 is installed on the lower floor portion F2. All of the plurality of storage sections 1a in each storage rack 1 are located at higher positions than the upper floor portion F1. Thus, with each lowest storage section 1a among the storage sections 1a that are arranged one above another along the vertical direction Y being a storage section 1a in the lowest horizontal row of storage sections 1a, the support member 9 in each storage section 1a in the lowest horizontal row is located at a higher position than the upper floor portion F1.

An area of the interior area E that is higher than the upper floor portion F1 and is surrounded by the walls K is the storing area E1. All of the plurality of storage sections 1a of the storage racks 1 are located within the storing area E1. In addition, an area of the interior area E that is lower than the upper floor portion F1 is the installation area E2. This installation area E2 is located lower than the support members 9 provided in the storage sections 1a in the lowest horizontal row. In other words, the interior area E includes the storing area E1 which is higher than the upper floor portion F1 and is surrounded by the walls K, and the installation area E2 which is lower than the upper floor portion F1.

Note that, in the present embodiment, the area of the interior area E that is higher than the upper floor portion F1 and is surrounded by the walls K is the storing area E1 because all of the plurality of storage sections 1a (supplying storage sections) of the storage racks 1 are at higher positions than the upper floor portion F1. However, if and when one or more of the storage sections 1a of the storage racks 1 are located at lower positions or heights than the upper floor portion F1, a part or all of the area of the interior area E that is lower than the upper floor portion F1 and is surrounded by the walls K may be specified or set aside as a part of the storing area E1. For example, the storing area E1 may be understood to extend down to the lower end of the support members 9 in the storage sections 1a (supplying storage sections) in the lowest horizontal row. In this case, the primary walls extend downward to a lower height than the upper floor portion F1.

Figure 2:
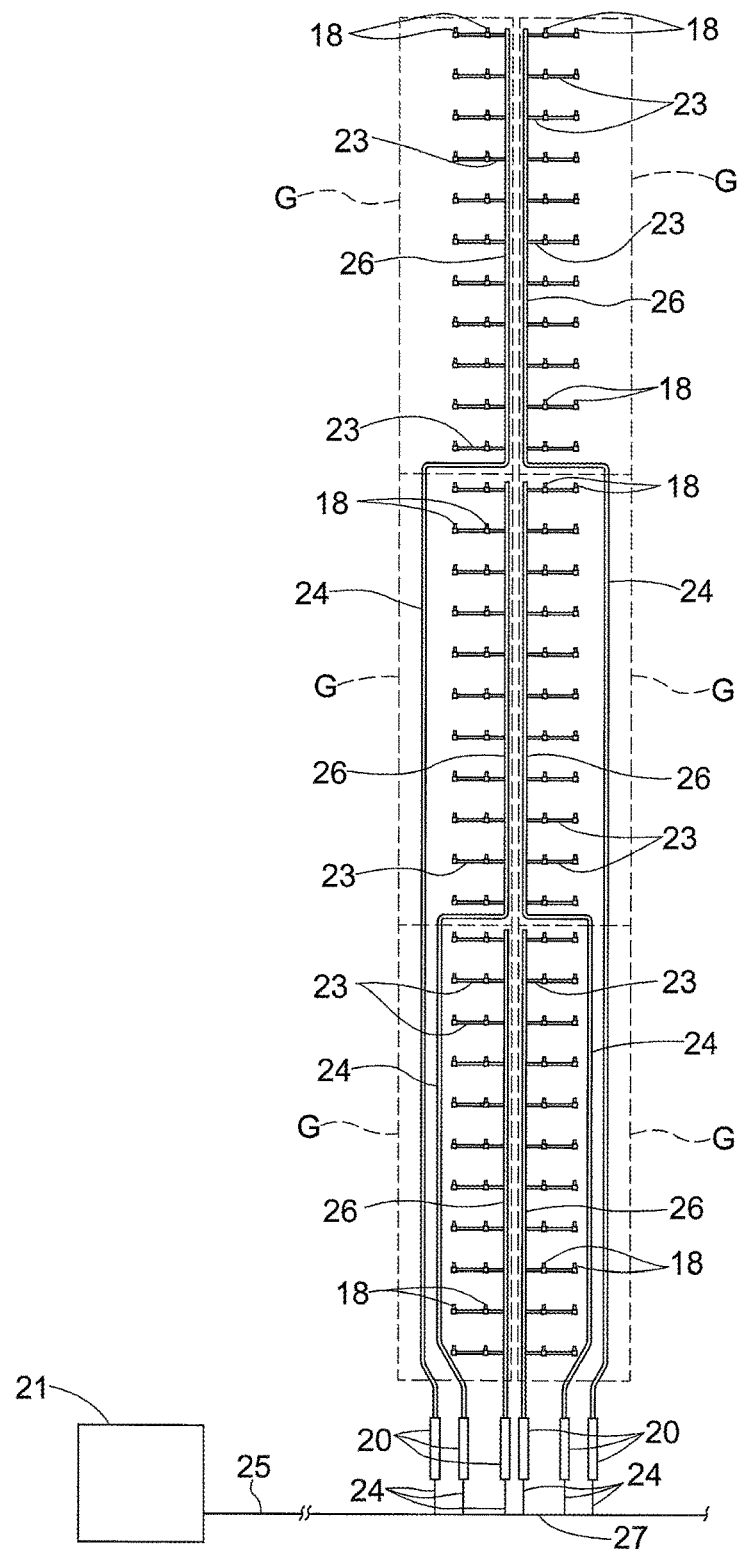
FIG. 2 is a front view of the container storage facility in accordance with the first embodiment.

Any given storage section 1a provided to either of the storage rack 1 belongs to one of a plurality of supplying storage section groups G. As shown in FIGS. 1 and 2, each supplying storage section group G consists of two or more storage sections 1a that are arranged one adjacent another only along the vertical direction Y, or in a single vertical row. In addition, a plurality of storage sections 1a in one vertical row inclusively between the highest horizontal row and the lowest horizontal row in the storage rack 1 are divided into a plurality of supplying storage section groups G. Each vertical row of the storage sections 1a in each storage rack 1 is formed of a plurality of supplying storage section groups G arranged one adjacent another along the vertical direction. As shown in FIG. 1, 33 storage sections 1a are in a row in the vertical direction Y in each storage rack 1 in the present embodiment. Each supplying storage section group G consists of 11 storage sections 1a arranged one adjacent another along the vertical direction Y. In other words, the 33 storage sections 1a in a row along the vertical direction Y are divided into three supplying storage section groups G. As such, each supplying storage section group G consists of a part of the plurality of storage sections 1a provided to each storage rack 1. And the two or more storage sections 1a that form a supplying storage section group G are arranged one adjacent another only along the vertical direction Y, or in a single vertical row.

[Stacker Crane]

As shown in FIG. 1, the stacker crane 2 has a travel carriage 11 configured to travel in front of a storage rack 1 (i.e., between the two storage racks 1) along a travel direction (i.e., lateral direction or the horizontal direction along which each storage rack 1 extends), a mast 12 arranged vertically on the travel carriage 11, a vertically movable member 13 which is vertically moved along the mast 12, and a transfer device 14 supported by the vertically movable member 13.

The transfer device 14 is moved along a travel direction as a result of the fact that the travel carriage 11 travels along the travel direction, and is moved along the vertical direction as a result of the fact that the vertically movable member 13 is moved vertically. In addition, while not described in detail, the transfer device 14 has a support member for supporting a container W, and a linkage mechanism configured to move the support member along a front and back direction (direction perpendicular to both the vertical direction and the lateral direction). The transfer device 14 is configured to transfer a container W to and from any of the storage sections 1a and to and from any of the transport conveyors 4.

And the stacker crane 2 transports a container W from a transport conveyor 4 to a storage section 1a and from a storage section 1a to a transport conveyor 4, through traveling of the travel carriage 11, vertical movement of the vertically movable member 13, and transfer operation by the transfer device 14.

The travel carriage 11 travels on and along travel rails 15 installed on the lower floor portion F2. At least a portion of the travel carriage 11 is located at a lower height than the support members 9 of the storage sections 1a in the lowest horizontal row of storage sections 1a. In the present embodiment, the entire travel carriage 11 is located at a lower height than the upper floor portion F1 and the support members 9 of the storage sections 1a in the lowest horizontal row of storage sections 1a.

[Gas Supplying Device]

Each gas supplying device 3 supplies dry air to inside the containers W stored in the storage sections 1a.

Each gas supplying device 3 has connectors 18, supply lines 19 (conduits for the gas), and mass flow controllers 20. Each gas supplying device 3 has a plurality of connectors 18. In addition, each of the plurality of storage sections 1a has one connector 18 provided therefor. Each such connector 18 is so located and arranged to be connected to a container W stored in the corresponding storage section 1a. The supply lines 19 divide and supply dry air (supplied from a supply source 21 installed outside the storing area E1) to a plurality of connectors 18. Each mass flow controller 20 controls the flow rate of dry air flowing through a supply line 19. Each gas supplying device 3 is provided with a plurality of mass flow controllers 20. In addition, each of the supplying storage section groups G has one mass flow controller 20 provided therefor. Incidentally, in FIG. 2, among a plurality of first supply lines 23 and second supply lines 24, only the first supply lines 23 and the second supply lines 24 are shown that are provided for storage sections 1a forming two vertical rows that are next to each other along a lateral direction.

The supply lines 19 include first supply lines 23, second supply lines 24, a third supply line 25, first branching supply lines 26, and a second branching supply line 27. A first supply line 23 is installed in and for each of the plurality of storage sections 1a. A second supply line 24 is installed for each of the plurality of supplying storage section groups G. The third supply line 25 is connected to the supply source 21 of dry air. Each first branching supply line 26 is installed to extend along the vertical direction Y of the storage rack 1.

Each first branching supply line 26 connects a second supply line 24 to a plurality of first supply lines 23 (i.e., two or more first supply lines 23 and 11 first supply lines 23 in the present embodiment) that correspond to a plurality of storage sections 1a that form one supplying storage section group G (i.e., two or more storage sections 1a and 11 storage sections 1a in the present embodiment) to divide and supply the dry air supplied from the second supply line 24 to each of the plurality of first supply lines 23. The second branching supply line 27 connects one third supply line 25 to a plurality of second supply lines 24 (six second supply lines 24 in the example of FIG. 2) to divide and supply the dry air supplied from the third supply line 25 to each of the plurality of second supply lines 24. Note that each first branching supply line 26 is, or corresponds to, the branching supply line.

A mass flow controller 20 is installed in each of the second supply lines 24. In other words, a mass flow controller 20 is installed in the single flow path of the second supply line 24. The mass flow controller 20 measures the mass flow rate of the dry air that flows through the second supply line 24 and controls the flow rate of the dry air that flows through the second supply line 24.

An orifice 29 and a filter 30 are provided in each of the plurality of first supply lines 23. Since the inner diameter of the first supply line 23 is reduced by the orifice 29 provided in each of the plurality of first supply lines 23 that are connected to the one second supply line 24, the flow rate of the dry air supplied to each of the plurality of storage sections 1a from the second supply line 24 can be equalized. In addition, the dust which flows through a first supply line 23 can be removed by the filter 30.

Thus, by providing a mass flow controller 20 in the second supply line 24 installed for each supplying storage section group G and not in a first supply line 23 installed in each storage section 1a, the mass flow controllers 20 can be located away from the storage sections 1a. In other words, this arrangement makes it easier to provide the mass flow controllers 20 in the installation area E2 located outside the storing area E1. The effect of the heat from the mass flow controllers on the containers can be reduced by providing the mass flow controllers 20 in the installation area E2. That is, in the present embodiment, each mass flow controller 20 is installed in the single flow path of a second supply line 24 and in the installation area E2 which is outside the storing area E1.

The installation area E2 in which the mass flow controllers 20 are installed is provided at a lower height than the support members 9 provided to the lowest horizontal row of storage sections 1a, or further outward in an outward direction X2 than outer ends, on the outward direction X2 side, of a plurality of storage sections 1a arranged one above another along the vertical direction Y. In the present embodiment, each installation area E2 is provided at a lower height than the support members 9 provided to the lowest horizontal row of storage sections 1a, and extends beyond, along an outward direction X2, than outer ends, on the outward direction X2 side, of a plurality of storage sections 1a arranged one above another along the vertical direction Y.

And each mass flow controllers 20 is installed between the lower end of an above-floor wall 31 and the lower floor portion F2. In addition, each mass flow controller 20 is installed such that it extends through a below-floor wall member 32a of a below-floor wall 32 along a front and back direction X and a part of the mass flow controller 20 is on the outward direction X2 side of the below-floor wall member 32a as seen along the vertical direction Y. Since each above-floor wall member 31a and the corresponding below-floor wall member 32a are installed at the same position along the front and back direction X, a portion of the mass flow controller 20 is also on the outward direction X2 side of the above-floor wall member 31a as seen along the vertical direction Y.

The air that flowed to inside the walls K through the intake opening 33 formed in the upper end of the above-floor walls 31 flows within the walls downward through the storing area E1 and the installation area E2 K in that order and flows out of the walls K through the outlet openings formed in the below-floor walls 32. Each mass flow controller 20 is installed at a position downstream of the storing area E1 with respect to the direction of air flow. Thus, it is difficult for the air heated by the mass flow controllers 20 to flow into the storing area E1.

Second Embodiment

The second embodiment of the article transport facility in accordance with the present invention is described next with reference to FIG. 5.

The description of the second embodiment below will focus mainly on features and structures that are different from those of the first embodiment, such as the shape formed by the walls K, and locations of the mass flow controllers 20, etc. And description will be omitted for features and structures that are identical to those in the first embodiment.

The ceilings C of a clean room includes an upper ceiling portion C1 and a lower ceiling portion C2 installed below the upper ceiling portion C1. The upper ceiling portion C1 is a ceiling which does not have holes for allowing air to pass through. The lower ceiling portion C2 is a ceiling which allows air to pass through along the vertical direction Y. In the present embodiment, the upper ceiling portion C1 is formed of concrete without through holes. The lower ceiling portion C2 is formed by filters, such as HEPA filters.

Note that the lower ceiling portion C2 having one or more filters is, or corresponds to, the ceiling having a flow-out portion which is a portion that allows clean air to flow out downward therefrom. The lower floor portion F2 is, or corresponds to, the installation floor which restricts or prevents gas from flowing along the vertical direction Y.

Figure 5:
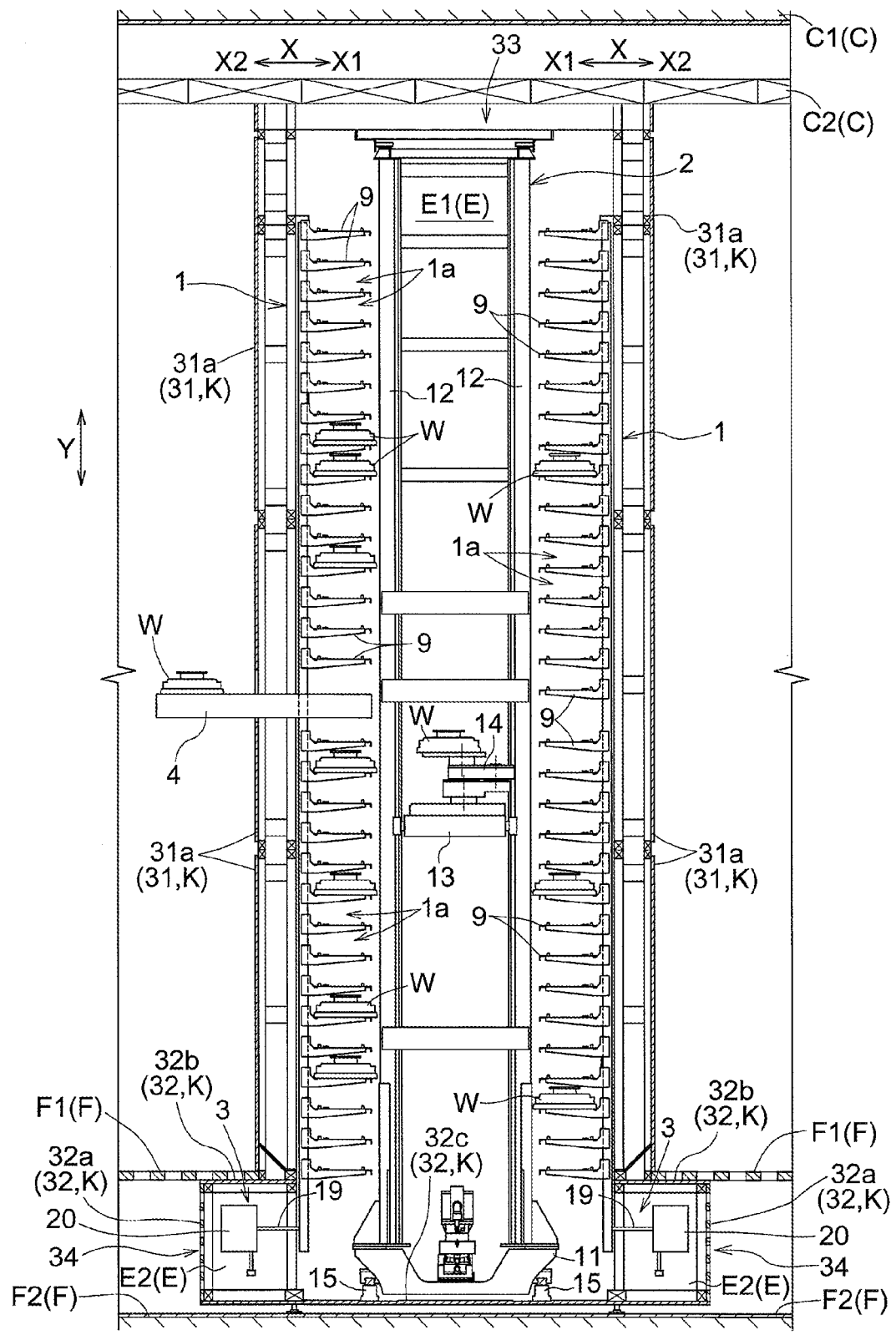
FIG. 5 is a side view of the container storage facility in accordance with a second embodiment.

As shown in FIG. 5, the walls K are installed directly below the lower ceiling portion C2. The walls K include above-floor walls 31 and below-floor walls 32. The above-floor walls 31 are located above the upper floor portion F1 and below the lower ceiling portion C2. The below-floor walls 32 are located below the upper floor portion F1 and above the lower floor portion F2. The below-floor walls 32 are formed to have a greater dimension along the front and back direction X than the above-floor wall 31. The walls K are so arranged to generally form, as a whole, a shape of an inverted T as seen along the longitudinal direction of the storage racks 1.

The above-floor walls 31 are so arranged to form a shape of a rectangular tube that is open at the top. In other words, as with the first embodiment, the above-floor walls 31 are so arranged to form a shape of a rectangular tube having four below-floor wall members 31a. However, the upper wall member 31b disclosed in the first embodiment is not present. Note that FIG. 5 shows an above-floor wall member 31a that closes of, or covers, one side along the front and back direction X, and another above-floor wall member 31a that closes off, or covers, the other side along the front and back direction X.

The below-floor walls 32 are so arranged to generally form a shape of a rectangular box in which a portion of its top surface is open. To describe in more detail, the below-floor walls 32 include four below-floor wall members 32a, a pair of blocking walls 32b which form the top surfaces of the below-floor walls 32, and a bottom wall 32c which forms the bottom surface for the below-floor walls 32. FIG. 5 shows a below-floor wall member 32a that closes off, or covers, one side, along the front and back direction X, of the storage area E1, another below-floor wall member 32a that closes off, or covers, the other side along the front and back direction X, a pair of blocking walls 32b which form the top surfaces of the below-floor walls 32, and the bottom wall 32c which forms the bottom surface. The pair of blocking walls 32b which form the top surfaces of the below-floor walls 32 are located at a position spaced apart upwardly from the lower floor portion F2 to extend along, or parallel to, the lower floor portion, and is configured to restrict or, more preferably, prevent flow of air through the blocking walls 32b. Note that each blocking wall 32b is, or corresponds to, the secondary wall.

The end portion, along an inward direction X1, of each blocking wall 32b is located between an inner surface of a below-floor wall member 32a and an end portion, on the outward direction X2 side, of the support member 9 along the front and back direction X. The end portion, on the outward direction X2 side, of each blocking wall 32b is located further outward in the outward direction X2 than the outside surface of a below-floor wall member 32a.

An outlet opening 34 which opens in an outward direction X2 is formed at an end portion, on an outward direction X2 side, of the below-floor walls 32. Two such outlet openings 34 are provided with one on each side as shown in FIG. 5. Each outlet opening 34 is covered by a below-floor wall member 32a which allows air to pass or move therethrough along the front and back direction X. More specifically, an outlet opening 34 is formed at each end portion, on the corresponding outward direction X2 side, of the below-floor walls 32. And each outlet opening 34 is partially closed by the corresponding below-floor wall member 32a.

The opening formed at the lower end of the above-floor walls 31 and the opening formed in the top surface of the below-floor walls 32 are connected to each other at the location of the upper floor portion F1 along the vertical direction Y. The storing area E1 surrounded by the above-floor walls 31 and the installation area E2 directly below the blocking walls 32b open to, or are in communication with, each other. In addition, an intake opening 33 which allows air to flow from above the above-floor walls 31 into the storing area E1 is formed at the upper end of the above-floor walls 31. In addition, an outlet opening 34 which allows air to flow out of the installation area E2 to the outward direction X2 side of a below-floor wall 32 is formed at each end portion, on the corresponding outward direction X2 side, of the below-floor walls 32. Each outlet opening 34 is formed at a location spaced apart downwardly from the end portion, on the corresponding outward direction X2 side, of the corresponding blocking wall 32b.

And a portion of a blocking wall 32b that is located closer to or toward an end on the inward direction X1 side is located adjacent to the lower end of an above-floor wall 31 such that flow of air from between the blocking wall 32b and an above-floor wall 31 is restricted or, more preferably, prevented.

To describe in more detail, each blocking wall 32b is joined to the bottom surface of the upper floor portion F1. And the lower end of the above-floor wall member 31a of the above-floor walls 31 is joined to the top surface of the upper floor portion F1. Thus, the above-floor wall 31 and the blocking wall 32b are located such that the upper floor portion F1 is held between the lower end of the above-floor wall member 31a and the top surface of the blocking wall 32b. As such, in the present embodiment, the upper floor portion F1 is located between the above-floor wall 31 and the blocking wall 32b to restrict or, more preferably, prevent any flow of air from therebetween.

The portion, located toward the inward direction X1 end, of a blocking wall 32b described above is at ⅓ of the dimension of the blocking wall 32b along a front and back direction, from the end on the inward direction X1 side of the blocking wall 32b.

In the present embodiment, each installation area E2 is provided at a lower height than the support members 9 of the storage sections 1a in the lowest horizontal row, and further outward in an corresponding outward direction X2 than outer ends, on the outward direction X2 side, of a plurality of storage sections 1a arranged one above another along the vertical direction Y. Each mass flow controller 20 is installed in the installation area E2. Each mass flow controller 20 in its entirety is located on an outward direction X2 side of the end portion, on an inward direction X1 side, of a blocking wall 32b and on an inward direction X1 side of the end portion, on an outward direction X2 side, of a blocking wall 32b. In addition, mass flow controllers 20 are located further outward in an outward direction X2 with respect to the support members 9 such that the mass flow controllers 20 do not overlap with the support members 9 as seen along the vertical direction Y.

The air that flowed out downward from the lower ceiling portion C2 at positions that correspond to inside the walls K flows to inside the walls K through the intake opening 33 formed at the upper end of the above-floor walls 31. And the air that flowed into within the above-floor walls 31 flows downward through the storing area E1, thereafter flows outward in the outward directions X2 in the installation area E2, and subsequently flows out of the walls K through the outlet openings 34.

Each mass flow controller 20 is installed at a position downstream of the storing area E1 with respect to the direction of air flow. Thus, it is difficult for the air heated by the mass flow controllers 20 to flow into the storing area E1.

Alternative Embodiments (1) In the first and second embodiments described above, each installation area is located at a lower position than the support members provided to the storage sections in the lowest horizontal row among the plurality of storage sections. However, the location(s) of the installation area(s) is/are not limited to such an arrangement. In other words, an installation area may be provided at a higher position than the storage sections in the highest horizontal row among the plurality of storage sections. Alternatively, an installation area may be provided outside the walls that cover the storage racks, more specifically, between the lower floor portion and the upper floor portions along the vertical direction and outward or outside of a below-floor portion along the front and back direction.

(2) In the first and second embodiments described above, each supplying storage section group is formed by two or more supplying storage sections that are arranged one adjacent another only along the vertical direction. However, a supplying storage section group may be formed by two or more supplying storage sections that are arranged one adjacent another only along the lateral direction, or along the vertical direction and the lateral direction. In addition, in the embodiments described above, an example is described in which a plurality of storage sections in one vertical row inclusively between the highest horizontal row and the lowest horizontal row in the storage rack are divided into a plurality of supplying storage section groups. However, one supplying storage section group G may be formed by all the storage sections in the entire vertical row in a storage rack.

(3) In the first and second embodiments described above, each container is described to hold a reticle (a photomask). However, a container may be a FOUP, etc., for holding one or more semiconductor wafers, or may be a container for holding food.

(4) In the first and second embodiments described above, the gas supplied to inside the containers by the gas supplying device is dry air. However, the gas supplied to inside the containers by the gas supplying device may be gas other than dry air, such as inert gas, such as nitrogen gas and gaseous argon.

(5) In the embodiments described above, all of the plurality of storage sections provided to the storage racks are supplying storage sections. However, only a part of the plurality of storage sections provided to the storage racks may be supplying storage sections.

In other words, only a part of the plurality of storage sections may be supplying storage sections to which gas is supplied by the gas supplying device with the rest of the plurality of storage sections being regular storage sections to which gas is not supplied by the gas supplying device.

SUMMARY OF EMBODIMENTS DESCRIBED ABOVE

A brief summary of the container storage facility described above is provided next.

A container storage facility comprises: a plurality of storage sections which are installed in a storing area and each of which is configured to store one or more containers; a gas supplying device configured to supply gas to inside of containers stored in supplying storage sections, with a part or all of the plurality of storage sections in the storing area being the supplying storage sections; wherein the gas supplying device has a plurality of connectors each of which is installed to a corresponding one of the supplying storage sections and is configured to be connected to a container stored in the corresponding one of the supplying storage sections, supply lines configured to divide and supply gas supplied from a supply source installed outside the storing area to the plurality of connectors, and a mass flow controller configured to control a flow rate of gas that flows through one of the supply lines, wherein, for a supplying storage section group formed by a part or all of the supplying storage sections, the supply lines include two or more first supply lines each of which is installed to a corresponding one of two or more supplying storage sections which form the supplying storage section group, a second supply line which forms a single flow path installed upstream of the two or more first supply lines with respect to a direction of flow of gas, and a branching supply line for dividing gas supplied from the second supply line into the two or more first supply lines, and wherein the mass flow controller is installed in the single flow path of the second supply line and in an installation area located outside the storing area.

With the arrangement described above, by installing a mass flow controller in the second supply line, one mass flow controller is provided for a plurality of supplying storage sections that form a supplying storage section group. Thus, the number of the mass flow controllers that have to be installed can be reduced, contributing to a reduction in the manufacturing cost of the gas supplying device. In addition, providing a mass flow controller in the second supply line located upstream of the first supply lines makes it easier to install the mass flow controller at a position away from the storage sections. And by providing the mass flow controller in the area located outside the storing area in which the plurality of storage sections are installed, the containers stored in the storage sections are not easily subjected to the effect of a rise in the temperature of the mass flow controller.

Here, the plurality of storage sections are preferably arranged one above another along a vertical direction, wherein each of the plurality of storage sections is preferably provided with a support member for supporting a bottom face portion of a container from below, and wherein the installation area is preferably provided at a lower position than the support member of a lowest storage section among the plurality of storage sections.

The arrangement described above allows the empty space at a lower position than the support member of the lowest storage section to be utilized to install the mass flow controller therein. To describe in more detail, for example, in an event that a stacker crane is provided to transport a container to a storage section, the support member provided to the lowest storage section would be located at such a height that the stacker crane can transport the container to the lowest storage section. In such an event, there is often an empty space at a position lower than the support member provided to the lowest storage section. Thus, such an empty space can be utilized to install the mass flow controller therein.

In addition, a downflow of gas (which may be air) may occur in the container storage facility caused by a flow generating device for causing gas in the storing area to flow downward. When there is such downflow, it is difficult for gas (around the mass flow controller), whose temperature has increased due to a rise in the temperature of the mass flow controller, to flow upward. Thus, the containers stored in the storage sections installed at higher positions than the mass flow controller are not easily subjected to the effect of heat due to a rise in the temperature of the mass flow controller.

In addition, the container storage facility preferably further comprises a flow generating device configured to cause gas within the container storage facility to flow downward through the storing area and the installation area.

With the arrangement described above, a downflow of gas in the facility flowing downward through the storing area and the installation area is generated by the flow generating device. Thus, it becomes difficult for gas (around the mass flow controller), whose temperature has increased due to a rise in the temperature of the mass flow controller, to flow upward. And the containers stored in the storage sections installed at higher positions than the mass flow controller are not easily subjected to the effect of heat due to a rise in the temperature of the mass flow controller.

In addition, the two or more supplying storage sections that form the supplying storage section group are preferably arranged one adjacent another only along a vertical direction.

With the arrangement described above, the two or more supplying storage sections to which gas is supplied by the supply lines are arranged one adjacent another along the vertical direction. And because the supply lines that supply gas to the two or more supplying storage sections are installed to extend mainly in the vertical direction, there are relatively small portions of supply lines that need to extend horizontally. This reduces the incidents of the supply lines blocking the downflow, and thus makes it easier for the gas to be smoothly moved downward by the flow generating device.

In addition, the plurality of storage sections are preferably arranged one above another along a vertical direction and one next to another along a lateral direction which is perpendicular to the vertical direction, wherein each of the plurality of storage sections is preferably provided with a support member for supporting a bottom face portion of a container from below, and wherein a stacker crane is preferably provided which is configured to transport a container to any of the plurality of storage sections, wherein the stacker crane preferably has a travel carriage configured to travel along the lateral direction, a mast arranged vertically on the travel carriage, and a transfer device configured to be movable along the mast along the vertical direction and to transfer the container to or from any of the plurality of storage sections, and wherein at least a portion of the travel carriage is preferably located at a lower position than support members provided to a lowest horizontal row of storage sections.

With the arrangement described above, since the support members provided to the lowest horizontal row of storage sections are installed at such a height that at least a portion of the travel carriage of the stacker crane can be located at a lower position than the support members, an empty space can be easily formed at a lower position than the support members provided to the lowest horizontal row of storage sections. Thus, such an empty space can be utilized to install the mass flow controller therein.

In addition, the gas supplying device preferably includes orifices such that each of the two or more first supply lines has an orifice provided therein.

With the arrangement described above, it becomes easier to supply gas supplied from the second supply line equally to each of the two or more supplying storage sections that form the supplying storage section group.

In addition, the container is preferably a container for holding a reticle, wherein gas supplied to inside the containers by the gas supplying device is preferably gas having lower humidity than gas in the plurality of storage sections.

The arrangement described above makes it less likely for the reticle held in the container to be subjected to the effect of the heat from the mass flow controller. In addition, when one mass flow controller is provided for a plurality of supplying storage sections by installing the mass flow controller in the second supply line, the amount of supply of the gas supplied to the plurality of supplying storage sections may have larger fluctuations compared to the case where a mass flow controller is provided to each of the plurality of supplying storage sections by installing a mass flow controller in each of the first supply lines. However, when a reticle is held in a container, the allowable magnitude of fluctuation in the amount of gas supplied to the container is generally greater compared to the case where semiconductor wafers etc. are held in the container. Thus, even when one mass flow controller is provided for a plurality of supplying storage sections, the fluctuation in the amount of supply of gas would stay within allowable value.

In addition, the container storage facility preferably further comprises walls that cover the storing area to restrict flow of gas (which may be air) in an surrounding area of the storage area, wherein the walls include primary walls each of which restricts flow of gas, and is installed to extend vertically and to be spaced apart upwardly from an installation floor which restricts flow of gas, wherein, along a direction of thickness of a primary wall as seen along a vertical direction, a first direction being a direction in which the storing area exists with respect to the primary wall, and a second direction being a direction opposite from the first direction, an intake opening is preferably formed for allowing gas to flow into the storing area from above the primary walls is formed at an upper end of the primary walls, and wherein the mass flow controller is preferably located vertically between an lower end of the primary wall and the installation floor and such that at least a portion of the mass flow controller is located on the second direction side with respect to the primary wall as seen along the vertical direction.

With the arrangement described above, the gas that flowed into within the walls through the intake opening formed at the top end of the primary walls flows downward through the storing area within the walls (because each primary wall restricts the flow of air through itself and allow flow of air along the vertical direction), thereafter flows between a primary wall and the installation floor and in the second direction, and flows out of the walls. And the mass flow controller is located between a lower end of the primary wall and the installation floor and such that at least a portion of the mass flow controller is located on the second direction side with respect to the primary wall as seen along the vertical direction. This allows the mass flow controller to be installed downstream of the storing area with respect to the direction of flow of gas. Thus, it becomes difficult for gas (around the mass flow controller) that is heated by the mass flow controller to flow into the storing area, reducing the incidents of the containers stored in the storage sections heated by the gas that has been heated by the mass flow controller.

Also, in addition to the primary walls, the walls preferably include a secondary wall which is located at a position spaced apart upwardly from the installation floor, extends along the installation floor, and is configured to restrict flow of gas (which may be air), wherein the storing area preferably communicates to the installation area which is at a lower position than the secondary wall, wherein an outlet opening for allowing gas to flow out of the installation area to a second direction side with respect to the secondary wall is preferably formed below an end portion, on the second direction side, of the secondary wall, wherein a portion of the secondary wall that is located toward to an end on the first direction side is preferably located adjacent to an lower end of a primary wall such that flow of gas from between the secondary wall and the primary wall is restricted, and wherein the mass flow controller is preferably located vertically between the secondary wall and the installation floor, and such that at least a portion of the mass flow controller is located on the second direction side with respect to the primary wall, and such that at least a portion of the mass flow controller is located on the second direction side with respect to an end, on the first direction side, of the secondary wall.

With the arrangement described above, the gas that flowed downward through the storing area within the walls flows between the primary wall and the installation floor and in the second direction, and thereafter flows through the installation area formed directly below the secondary wall, subsequently flows out of the walls through the outlet opening formed at a lower position than the end portion of the secondary wall. In other words, by allowing the gas within the walls to flow through the installation area formed by providing the secondary wall before allowing the gas to flow out of the walls, instead of allowing gas within the walls to flow out directly through a primary wall, gas is agitated and mixed while flowing through the installation area.

More specifically, for example, when the articles stored in each storage rack are containers for holding semiconductor substrates, the inert gas, such as nitrogen gas, which is used to fill the containers sometimes flows out of a container. When gas is so released from a container, the concentration of the gas may become high locally. In other words, the concentration of oxygen may become low locally. However, by allowing the gas within the walls to flow through the installation area formed by providing the secondary wall and to be mixed before the gas is allowed to flow out of the walls, the oxygen concentration of the gas that flows out of the outlet opening can be made more constant or uniform.

Also, in addition to the primary walls, the walls preferably include a secondary wall which is located at a position spaced apart upwardly from the installation floor, extends along the installation floor, and is configured to restrict flow of air, the walls are preferably installed directly below a ceiling provided with an flow-out portion which allows clean air to flow out downward therefrom, wherein a work floor which a worker can walk on and which allows clean air to flow through along the vertical direction is preferably provided at a higher position than the secondary wall, wherein the secondary wall is preferably installed next to the work floor along the vertical direction, and wherein flow of air along the vertical direction through a portion of the work floor that is next to the secondary wall along the vertical direction is preferably restricted by the secondary wall.

With the arrangement described above, since the work floor is installed at an even higher position than the secondary wall installed to be spaced apart upwardly from the installation floor, a worker can work on an object at a high location in the storage rack. And since the space below the wall floor can be utilized to form the installation area, the installation area can be formed without getting in the way of the surrounding area or objects.

Further, since flow of air through a portion of the work floor that is next to the secondary wall along the vertical direction is restricted by the presence of the secondary wall, gas is prevented from flowing out of the work floor in the area near the storage rack. Thus, even if a worker is present near the wall to carry an article into or out of the storage rack, gas flows upwardly from locations that are further on the second direction side than the location where the worker is; thus, any effect on the worker due to the gas that flows out can be reduced.

What is claimed is:

1. A container storage facility comprising:
   a plurality of storage sections which are installed in a storing area and each of which is configured to store a container;
   a gas supplying device configured to supply gas to inside of containers stored in supplying storage sections, with a part or all of the plurality of storage sections in the storing area being the supplying storage sections; and
   walls that cover the storing area to restrict flow of air in a surrounding area of the storage area.
   wherein the gas supplying device has a plurality of connectors each of which is installed to a corresponding one of the supplying storage sections and is configured to be connected to a corresponding container stored in the corresponding one of the supplying storage sections, supply lines configured to divide and supply gas supplied from a supply source installed outside the storing area to the plurality of connectors, and a mass flow controller configured to control a flow rate of gas that flows through one of the supply lines,
   wherein, for a supplying storage section group formed by a part or all of the supplying storage sections, the supply lines include two or more first supply lines each of which is installed to a corresponding one of two or more supplying storage sections which form the supplying storage section group, a second supply line which forms a single flow path installed upstream of the two or more first supply lines with respect to a direction of flow of gas, and a branching supply line for dividing gas supplied from the second supply line into the two or more first supply lines, and
   wherein the mass flow controller is installed in the single flow path of the second supply line and in an installation area located outside the storing area.
   wherein the walls include primary walls each of which restricts flow of air, and is installed to extend vertically and to be spaced apart upwardly from an installation floor which restricts flow of air.
   wherein, along a direction of thickness of a primary wall as seen along a vertical direction, a first direction being a direction in which the storing area exists with respect to the primary wall, and a second direction being a direction opposite from the first direction,
   wherein an intake opening is formed for allowing air to flow into the storing area from above the primary walls is formed at an upper end of the primary walls,
   wherein the mass flow controller is located between a lower end of the primary wall and the installation floor and such that at least a portion of the mass flow controller is located on the second direction side with respect to the primary wall as seen along the vertical direction,
   wherein in addition to the primary walls, the walls include a secondary wall which is located at a position spaced apart upwardly from the installation floor, extends along the installation floor, and is configured to restrict flow of air,
   wherein the storing area communicates to the installation area which is at a lower position than the secondary wall,
   wherein an outlet opening for allowing air to flow out of the installation area to a second direction side with respect to the secondary wall is formed below an end portion, on the second direction side, of the secondary wall,
   wherein a portion of the secondary wall that is located toward to an end on the first direction side is located adjacent to a lower end of a primary wall such that flow of air from between the secondary wall and the primary wall is restricted, and
   wherein the mass flow controller is located between the secondary wall and the installation floor, and such that at least a portion of the mass flow controller is located on the second direction side with respect to the primary wall, and such that at least a portion of the mass flow controller is located on the second direction side with respect to an end, on the first direction side, of the secondary wall.

2. The container storage facility as defined in claim 1, wherein the plurality of storage sections are arranged one above another along a vertical direction,
   wherein each of the plurality of storage sections is provided with a support member for supporting a bottom face portion of the container from below, and
   wherein the installation area is provided at a lower position than the support member of a lowest storage section among the plurality of storage sections.

3. The container storage facility as defined in claim 1, further comprising:
   a blower fan configured to cause gas within the container storage facility to flow downward through the storing area and the installation area.

4. The container storage facility as defined in claim 1, wherein the two or more supplying storage sections that form the supplying storage section group are arranged one adjacent another only along a vertical direction.

5. The container storage facility as defined in claim 1, wherein the plurality of storage sections are arranged one above another along a vertical direction and one next to another along a lateral direction which is perpendicular to the vertical direction,
   wherein each of the plurality of storage sections is provided with a support member for supporting a bottom face portion of the container from below, and
   wherein a stacker crane is provided which is configured to transport the container to any of the plurality of storage sections,
   wherein the stacker crane has a travel carriage configured to travel along the lateral direction, a mast arranged vertically on the travel carriage, and a transfer device configured to be movable along the mast along the vertical direction and to transfer the container to or from any of the plurality of storage sections, and
   wherein at least a portion of the travel carriage is located at a lower position than the support members provided in a lowest horizontal row of storage sections.

6. The container storage facility as defined in claim 1, wherein the gas supplying device includes orifices such that each of the two or more first supply lines has an orifice provided therein.

7. The container storage facility as defined in claim 1, wherein the container is a container for holding a reticle, and
   wherein the gas supplied to inside the containers by the gas supplying device is gas having lower humidity than gas in the plurality of storage sections.

8. The container storage facility as defined in claim 1, wherein the walls are installed directly below a ceiling provided with a flow-out portion which allows clean air to flow out downward therefrom, wherein a work floor which a worker can walk on and which allows clean air to flow through along the vertical direction is provided at a higher position than the secondary wall, wherein the secondary wall is installed next to the work floor along the vertical direction, and wherein flow of air along the vertical direction through a portion of the work floor that is next to the secondary wall along the vertical direction is restricted by the secondary wall.

9. A container storage facility comprising:

a plurality of storage sections which are installed in a storing area and each of which is configured to store a container;

a gas supplying device configured to supply gas to inside of containers stored in supplying storage sections, with a part or all of the plurality of storage sections in the storing area being the supplying storage sections; and a work floor which a worker can walk on and which allows gas to flow through along a vertical direction;

wherein the gas supplying device has a plurality of connectors each of which is installed to a corresponding one of the supplying storage sections and is configured to be connected to a corresponding container stored in the corresponding one of the supplying storage sections, supply lines configured to divide and supply gas supplied from a supply source installed outside the storing area to the plurality of connectors, and a mass flow controller configured to control a flow rate of gas that flows through one of the supply lines, wherein, for a supplying storage section group formed by a part or all of the supplying storage sections, the supply lines include two or more first supply lines each of which is installed to a corresponding one of two or more supplying storage sections which form the supplying storage section group, a second supply line which forms a single flow path installed upstream of the two or more first supply lines with respect to a direction of flow of gas, and a branching supply line for dividing gas supplied from the second supply line into the two or more first supply lines, and wherein the mass flow controller is installed in the single flow path of the second supply line and in an installation area located outside the storing area and below the work floor.

10. The container storage facility as defined in claim 9, wherein the plurality of storage sections are arranged one above another along a vertical direction, wherein each of the plurality of storage sections is provided with a support member for supporting a bottom face portion of the container from below, and wherein the installation area is provided at a lower position than the support member of a lowest storage section among the plurality of storage sections.

11. The container storage facility as defined in claim 9, further comprising:

a blower fan configured to cause gas within the container storage facility to flow downward through the storing area and the installation area.

12. The container storage facility as defined in claim 9, wherein the two or more supplying storage sections that form the supplying storage section group are arranged one adjacent another only along a vertical direction.

13. The container storage facility as defined in claim 9, wherein the plurality of storage sections are arranged one above another along a vertical direction and one next to another along a lateral direction which is perpendicular to the vertical direction, wherein each of the plurality of storage sections is provided with a support member for supporting a bottom face portion of the container from below, and wherein a stacker crane is provided which is configured to transport the container to any of the plurality of storage sections, wherein the stacker crane has a travel carriage configured to travel along the lateral direction, a mast arranged vertically on the travel carriage, and a transfer device configured to be movable along the mast along the vertical direction and to transfer the container to or from any of the plurality of storage sections, and wherein at least a portion of the travel carriage is located at a lower position than the support members provided in a lowest horizontal row of storage sections.

14. The container storage facility as defined in claim 9, wherein the gas supplying device includes orifices such that each of the two or more first supply lines has an orifice provided therein.

15. The container storage facility as defined in claim 9, wherein the container is a container for holding a reticle, and wherein the gas supplied to inside the containers by the gas supplying device is gas having lower humidity than gas in the plurality of storage sections.

16. The container storage facility as defined in claim 9, further comprising:

walls that cover the storing area to restrict flow of air in a surrounding area of the storage area, wherein the walls include primary walls each of which restricts flow of air, and is installed to extend vertically and to be spaced apart upwardly from an installation floor which restricts flow of air, wherein, along a direction of thickness of a primary wall as seen along a vertical direction, a first direction being a direction in which the storing area exists with respect to the primary wall, and a second direction being a direction opposite from the first direction, wherein an intake opening is formed for allowing air to flow into the storing area from above the primary walls is formed at an upper end of the primary walls, wherein the mass flow controller is located between a lower end of the primary wall and the installation floor and such that at least a portion of the mass flow controller is located on the second direction side with respect to the primary wall as seen along the vertical direction.

17. The container storage facility as defined in claim 16, wherein in addition to the primary walls, the walls include a secondary wall which is located at a position spaced apart upwardly from the installation floor, extends along the installation floor, and is configured to restrict flow of air, wherein the storing area communicates to the installation area which is at a lower position than the secondary wall, wherein an outlet opening for allowing air to flow out of the installation area to a second direction side with respect to the secondary wall is formed below an end portion, on the second direction side, of the secondary wall, wherein a portion of the secondary wall that is located toward to an end on the first direction side is located adjacent to a lower end of a primary wall such that flow of air from between the secondary wall and the primary wall is restricted, and wherein the mass flow controller is located between the secondary wall and the installation floor, and such that at least a portion of the mass flow controller is located on the second direction side with respect to the primary wall, and such that at least a portion of the mass flow controller is located on the second direction side with respect to an end, on the first direction side, of the secondary wall.

* * * * *

UNITED STATES PATENT AND TRADEMARK OFFICE
CERTIFICATE OF CORRECTION

PATENT NO. : 10,583,983 B2
APPLICATION NO. : 15/474364
DATED : March 10, 2020
INVENTOR(S) : Shinsuke Kawamura et al.

It is certified that error appears in the above-identified patent and that said Letters Patent is hereby corrected as shown below:

In the Claims

Column 17, Line 12, Claim 1, delete "area." and insert -- area, --

Column 17, Line 36, Claim 1, delete "area." and insert -- area, --

Column 17, Line 40, Claim 1, delete "air." and insert -- air, --

Signed and Sealed this
Nineteenth Day of May, 2020

Andrei Iancu
*Director of the United States Patent and Trademark Office*